US007533294B2

(12) United States Patent
Mishra et al.

(10) Patent No.: US 7,533,294 B2
(45) Date of Patent: May 12, 2009

(54) FUNCTIONAL COVERAGE DRIVEN TEST GENERATION FOR VALIDATION OF PIPELINED PROCESSORS

(75) Inventors: Prabhat Mishra, Gainesville, FL (US); Nikil Dutt, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 497 days.

(21) Appl. No.: 11/223,784

(22) Filed: Sep. 9, 2005

(65) Prior Publication Data

US 2006/0107158 A1 May 18, 2006

Related U.S. Application Data

(60) Provisional application No. 60/609,045, filed on Sep. 9, 2004.

(51) Int. Cl.
G06F 11/00 (2006.01)
(52) U.S. Cl. .................. 714/10; 714/32; 708/233
(58) Field of Classification Search .............. 714/10, 714/32, 33, 741; 708/233
See application file for complete search history.

(56) References Cited

U.S. PATENT DOCUMENTS

| 6,647,513 | B1 * | 11/2003 | Hekmatpour | 714/37 |
| 6,732,297 | B2 * | 5/2004 | Oura | 714/33 |
| 6,973,630 | B1 * | 12/2005 | Dao et al. | 716/1 |
| 2001/0034594 | A1 * | 10/2001 | Kohno et al. | 703/14 |

OTHER PUBLICATIONS

K.L. McMillan, The SMV System for SMV version 2.5.4, Edited and updated by Sergey Berezin, Carnegie Mellon University, Nov. 6, 2000, pp. 1-27.

Mishra et al., *Graph-based Functional Test Program Generation for Pipelined Processors*, Proceedings of the Design, Automation and Test in Europe Conference and Exhibition (Date 2004), IEEE Computer Society, 6 pages.

Mishra et al., *Functional Coverage Driven Test Generation for Validation of Pipelined Processors*, Proceedings of the Design, Automation and Test in Europe Conference and Exhibition (Date 2005), IEEE Computer Society, 6 pages.

Koo et al., *Functional Test Generation Using Property Decompositions for Validation of Pipelined Processors*, Date 2006, IEEE Computer Society, 6 pages.

Adir et al., *Genesys-Pro: Innovations in Test Program Generation for Functional Processor Verification*, copublished by the IEEE CS and the IEEE CASS, Mar.-Apr. 2004, pp. 84-93.

Aharon et al., *Test Program Generation for Functional Verification of PowerPC Processors in IBM*, Design Automation Conference (DAC) 1995, pp. 1-7.

Behm et al., *Industrial Experience with Test Generation Languages for Processor Verification*, Design Automation Conference (DAC) 2004, Jun. 7-11, 2004, San Diego, CA., pp. 36-40.

(Continued)

*Primary Examiner*—Christopher S McCarthy
(74) *Attorney, Agent, or Firm*—Orrick, Herrington & Sutcliffe LLP

(57) ABSTRACT

A functional coverage based test generation technique for pipelined architectures is presented. A general graph-theoretic model is developed that can capture the structure and behavior (instruction-set) of a wide variety of pipelined processors. A functional fault model is developed and used to define the functional coverage for pipelined architectures. Test generation procedures are developed that accept the graph model of the architecture as input and generate test programs to detect all the faults in the functional fault model. A graph model of the pipelined processor is automatically generated from the specification using functional abstraction. Functional test programs are generated based on the coverage of the pipeline behavior. Module level property checking is used to reduce test generation time.

15 Claims, 5 Drawing Sheets

OTHER PUBLICATIONS

Bjesse et al., *Using Counter Example Guided Abstraction Refinement to Find Complex Bugs*, Proceedings of the Design, Automation and Test in Europe Conference and Exhibition (Date 2004), IEEE Computer Society, 6 pages.

Burch et al., *Automatic Verification of Pipelined Microprocessor Control*, Conference on Computer-Aided Verification, Jun. 21-23, 1994, pp. 1-17.

Van Campenhout et al., *High-Level Test Generation for Design Verification of Pipelined Microprocessors*, Design Automation Conference (DAC) 1999, 4 pages.

Chen et al., *A Scalable Software-Based Self-Test Methodology for Programmable Processors*, Design Automation Conference (DAC) 2003, 6 pages.

Clarke et al., *Efficient Generation of Counterexamples and Witnesses in Symbolic Model Checking*, 32nd ACM/IEEE Design Automation Conference, 1995, pp. 1-6.

Fine et al., *Coverage Directed Test Generation for Functional Verification using Bayesian Networks*, Design Automation Conference (DAC) 2003, pp. 1-17.

Halabi et al., *Expression: A Language for Architecture Exploration through Compiler/Simulator Retargetability*, Date 1999, pp. 1-6.

Ho et al., *Architecture Validation for Processors*, ISCA 1995, 10 pages.

Ho et al., *Formal Verification of Pipeline Control Using Controlled Token Nets and Abstract Interpretation*, ICCAD 1998, pp. 529-536.

Iwashita et al., *Automatic Test Program Generation for Pipelined Processors*, ICCAD 1994, pp. 580-583.

Jacobi, *Formal Verification of Complex Out-of-Order Pipelines by Combining Model-Checking and Theorem-Proving*, CAV 2002, LNCS 2404, pp. 309-323.

Jhala et al., *Microarchitecture Verification by Compositional Model Checking*, CAV 2001—13th Intl. Conference on Computer-Aided Verification, 15 pages.

Lai et al., *Instruction Level-DFT for Testing Processor and IP Cores in System-on-a-Chip*, Design Automation Conference (DAC) 2001, Jun. 18-22, 2001, Las Vegas, NV, pp. 59-64.

Mishra et al., *Automatic Functional Test Program Generation for Pipelined Processors Using Model Checking*, HLDVT 2002, pp. 99-103.

Mishra et al., *Functional Abstraction driven Design Space Exploration of Heterogeneous Programmable Architectures*, ISSS 2001, Oct. 1-3, 2001. Montreal, Canada, pp. 256-261.

Parthasarathy et al., *Safety Property Verification Using Sequential SAT and Bounded Model Checking*, IEEE Design & Test of Computers 2004, Mar.-Apr. 2004, pp. 132-143.

Shen et al., *Functional Verification of the Equator MAP1000 Microprocessor*, Design Automation Conference (DAC) 1999, New Orleans, LA)1999 ACM, 6 pages.

Shakkebaek et al., *Formal Verification of Out-of-Order Execution Using Incremental Flushing*, CAV 1998, vol. 1427, pp. 98-109.

Ur et al., *Micro Architecture Coverage Directed Generation of Test Programs*, Design Automation Conference (DAC) 1999, New Orleans, LA, 6 pages.

Wagner et al., *Stress Test: An Automatic Approach to Test Generation Via Activity Monitors*, Design Automation Conference (DAC) 2005, pp. 783.

\* cited by examiner

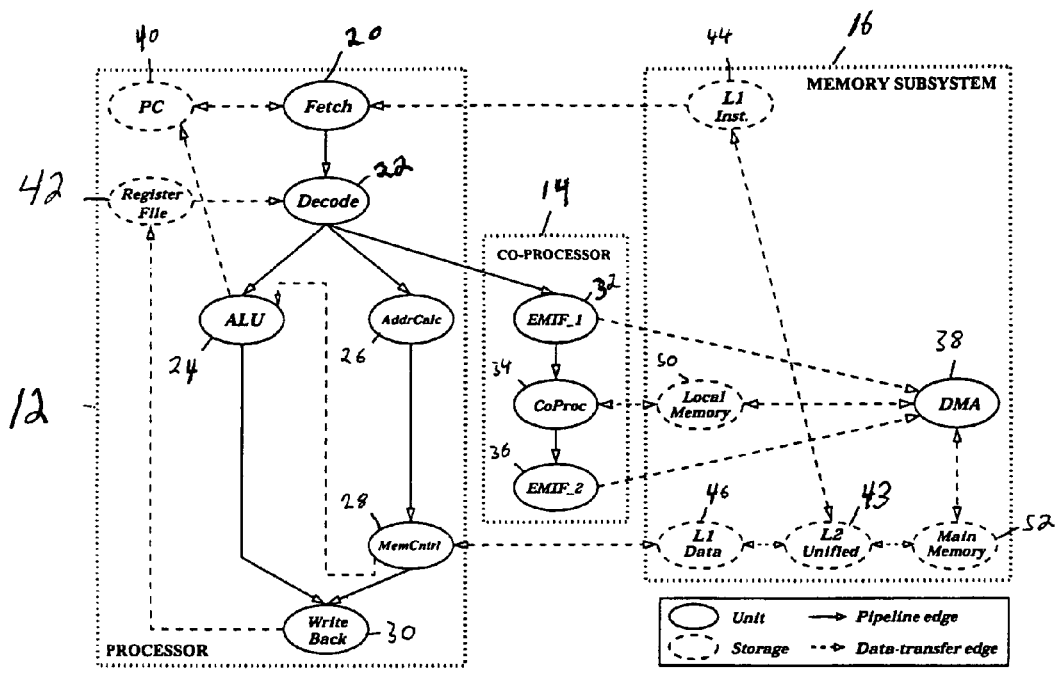
Figure 1. A Structure Graph of a Simple Architecture
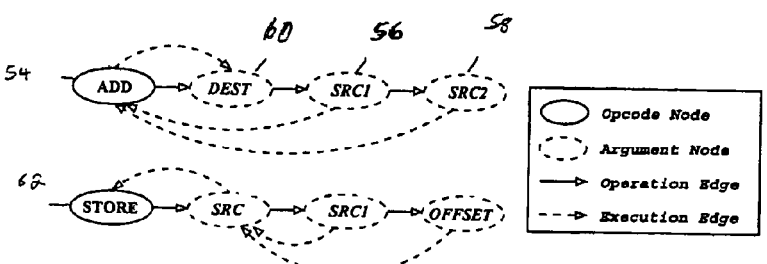
Figure 2. A Fragment of the Behavior Graph

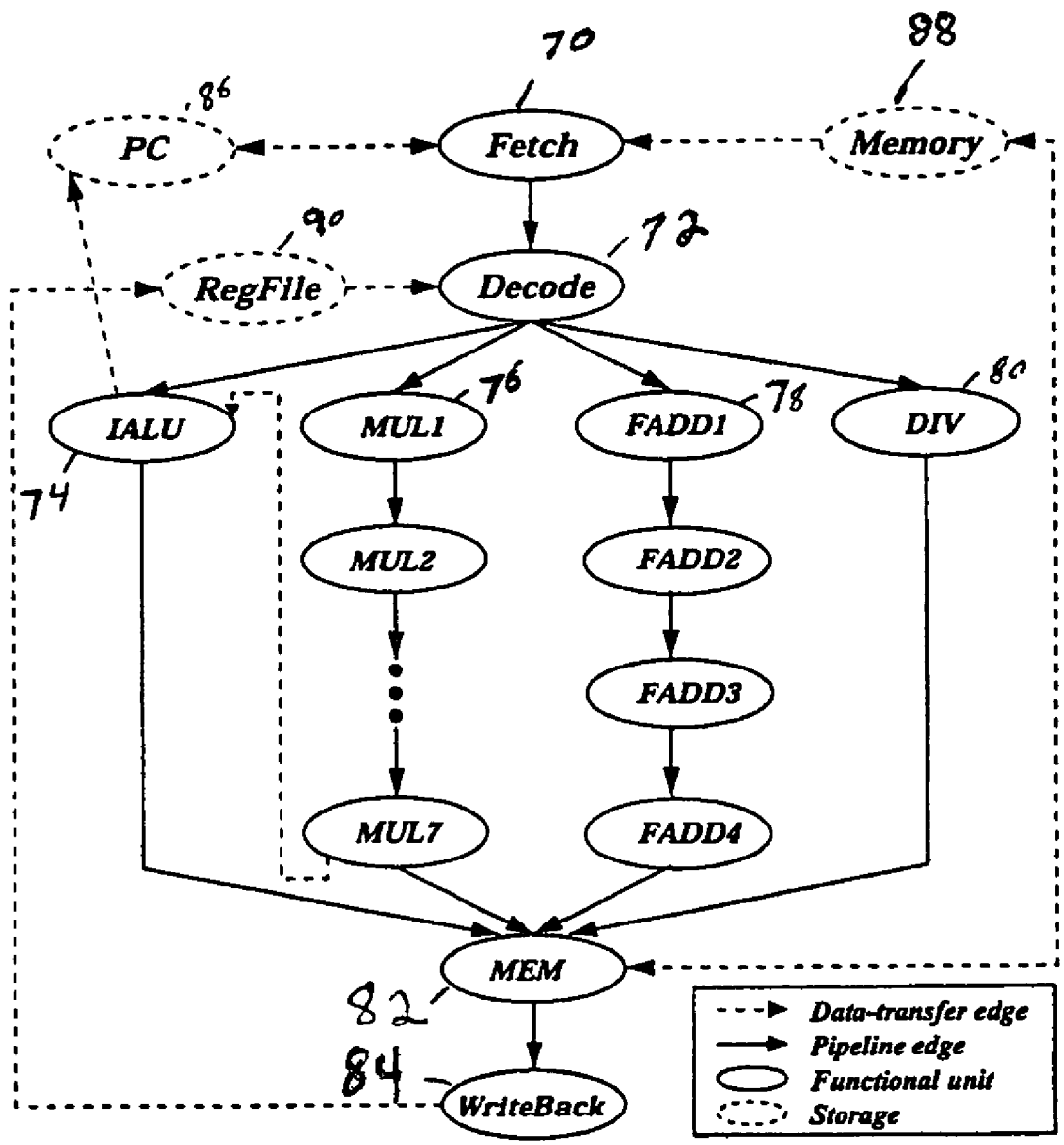
Figure 3. VLIW DLX architecture

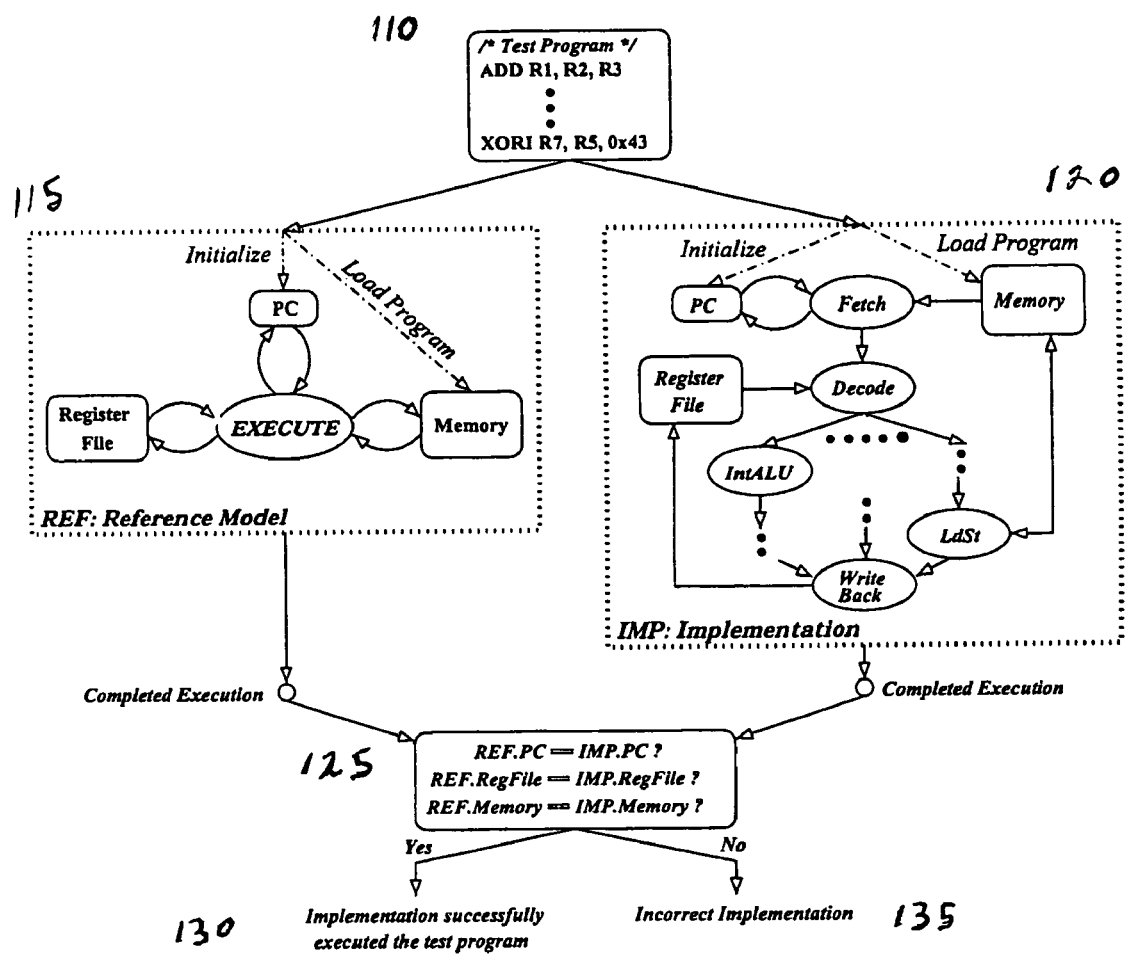
Figure 4. Validation of the implementation

FUNCTIONAL COVERAGE DRIVEN TEST GENERATION FOR VALIDATION OF PIPELINED PROCESSORS

This application claims the benefit of provisional application Ser. No. 60/609,045 filed on Sep. 9, 2004. The priority of this prior application is expressly claimed, and the disclosure of this prior application is hereby incorporated by reference in its entirety.

This invention was made with Government support under Grant Nos. 0203813 and 0205712 awarded by the National Science Foundation. The Government has certain rights in this invention.

FIELD OF THE INVENTION

Embodiments of the invention relate to microprocessor design and validation tools, and more particularly to systems and methods for validating the correct functioning of a microprocessor design.

BACKGROUND

As embedded systems continue to face increasingly higher performance requirements, deeply pipelined processor architectures are being employed to meet desired system performance. Functional validation of such programmable processors is one of the most complex and expensive tasks in the current Systems-on-Chip (SOC) design methodology. Simulation is the most widely used form of microprocessor verification: millions of cycles are spent during simulation using a combination of random and directed test cases in traditional validation flow. Several coverage measures are commonly used, such as code coverage, toggle coverage and fault coverage, to attempt to ensure that all aspects of a microprocessor design have been validated by the simulation. Unfortunately, these measures do not have any direct relationship to the functionality of the device. For example, none of these measures determine if all possible interactions of hazards, stalls and exceptions are tested in a processor pipeline. Additionally, certain heuristics and design abstractions are used to generate directed random test cases. However, due to the bottom-up nature and localized view of these heuristics the generated test cases may not yield a good coverage. The problem is further aggravated due to the lack of a comprehensive functional coverage metric.

Specification driven test generation has been introduced as a top-down validation technique for pipelined processors. The processor is specified using an Architecture Description Language (ADL). A SMV (Symbolic Model Verifier) description of the processor is generated from the ADL specification of the architecture. The SMV system is a tool for checking finite state systems against logic specifications for those systems. Further details about SMV are available in K. L. McMillan, *The SMV System for SMV version 2.5.4*. Specific properties are applied to the processor model using the SMV model checker. For example, to generate a test case to stall the decode unit, the property states that the decode unit is not stalled. The model checker produces a counter-example that stalls the decode unit. The generated counterexample is converted into a test program consisting of processor instructions. Since, the complete processor is modeled using SMV, this approach is limited by the capacity restrictions of the tool. As a result, it is not possible to model a detailed description of the processor and generate test programs which cover all of the functional aspects of the processor. Furthermore, the test generation time is long. Thus there is a need for a coverage metric based on the functionality of the processor design, and for which test program generation is automated.

SUMMARY OF THE INVENTION

To define a useful functional coverage metric, it is preferable to define a fault model of the design that is described at the functional level and independent of the implementation details. In an embodiment of the invention, a functional fault model for pipelined processors is presented. The fault model is applicable to the wide variety of today's microprocessors from various architectural domains (such as Reduced Instruction Set Computer (RISC), Digital Signal Processor (DSP), Very Long Instruction Word (VLIW) and Superscalar) that differ widely in terms of their structure (organization) and behavior (instruction-set). A graph-theoretic model has been developed, that can capture a wide spectrum of pipelined processors, coprocessors, and memory subsystems. Functional coverage has been defined based on the effects of faults in the fault model applied at the level of the graph-theoretic model. This allows for computation of functional coverage of a pipelined processor for a given set of random or constrained-random test sequences.

Embodiments of the invention present test generation procedures that accept the graph model of the pipelined processor as input and generate test programs to detect all the faults in the functional fault model. In two inventive aspects of the techniques of an embodiment of the invention, functional coverage can be used in an existing validation flow that uses random or directed-random test programs and the number of test sequences generated by the method of an embodiment of the invention to obtain a given fault (functional) coverage is several orders of magnitude less than the random or constrained-random test programs.

To make the ADL driven test generation applicable to realistic embedded processors, an embodiment of the invention automates a top-down validation method for pipelined processors. The processor model generation from the ADL specification is automated using functional abstraction. A comprehensive functional coverage metric of the pipeline behavior in terms of pipeline graph coverage is crafted, that can be used to automatically generate test programs. The pipeline graph is generated from the ADL specification of the processor. Each node in the graph corresponds to a functional unit (module) or storage component in the processor. The behavior of each node is described using SMV language. An edge in the graph represents instruction (or data) transfer between the nodes. Finally, an efficient test generation technique is provided that traverses the pipeline graph to generate test programs based on the coverage metric. The technique of an embodiment of the invention breaks a processor level property into multiple module level properties and applies them. The technique can model complex designs and can enable fast generation of functional test programs. Since, the SMV is applied at the module level, this technique can handle larger designs and also drastically reduces the test generation time.

BRIEF DESCRIPTION OF THE DRAWINGS

The accompanying drawings are included to provide a further understanding of embodiments of the invention and together with the Detailed Description, serve to explain the principles of the embodiments disclosed.

FIG. 1 depicts a structure graph of a processor architecture.

FIG. 2 depicts a portion of a behavior graph of a processor architecture.

FIG. 3 depicts a structure graph of the VLIW DLX processor architecture.

FIG. 4 depicts a flowchart of a method of validating an implementation of a processor.

DETAILED DESCRIPTION OF THE PREFERRED EMBODIMENTS

Figure 5:
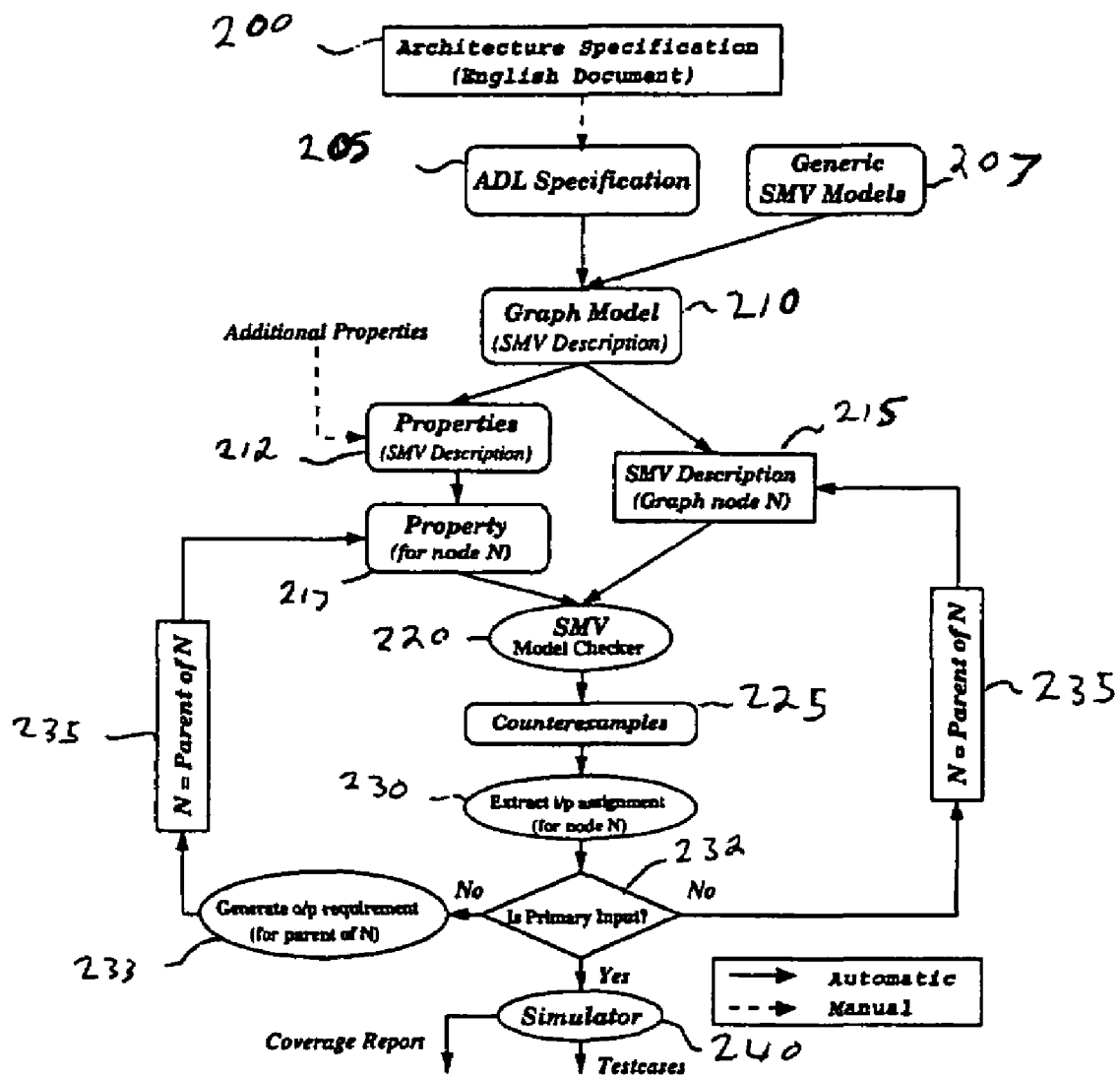
FIG. 5 depicts a flowchart of a method of generating test programs.

In an embodiment of the invention, generation of test programs for validation of pipelined processors begins with design of an architectural model of the processor to be validated. Among the aspects that should be considered in designing an efficient architectural model are the following considerations. First, the architecture model should be based on a functional description of the processor, such as the description available in a typical user's manual for the processor to be modeled. Second, the model should be able to treat the processor organization and instruction-set as parameters of the test generation procedures. Finally, the architecture model should be able to support a functional fault model describing faults in various computations performed by the processor. Consideration of these aspects will allow fault model developers to describe faulty behavior without requiring the developer to know the implementation details of the processor.

As shown in FIG. 1, a graph-theoretic model of the processor captures the structure and behavior of the processor, using the information available in a typical user's manual for a processor architecture. This graph model captures the functional description of the processor. This graph model may be constructed manually by the designer from the data in the user's manual, or as discussed further below the graph may be automatically derived from a formal architecture description, as expressed in an architecture description language (ADL). The structure graph 10 of the simplified example processor architecture of FIG. 1 is based on a block diagram view, such as that typically found in a processor manual. More complex processor architectures can be similarly modeled based on the block diagram view in the processor architecture manual. The processor architecture 10 includes the processor 12, a co-processor 14, and a memory sub-system 16. The structure is modeled as a graph $G_S = (V_S, E_S)$, where $V_S$ denotes a set of nodes representing processor components, and $E_S$ denotes a set of edges between the nodes $V_S$, indicating connections between the nodes. $V_S$ includes two types of components, $V_{unit}$ and $V_{storage}$.

$V_{unit}$ is a set of functional units, which includes the instruction fetch unit 20, the instruction decode unit 22, the ALU 24, the address calculation unit 26, the memory control unit 28, the write back unit 30, the first external memory interface unit 32 (EMIF_1), the co-processor 34, the second external memory interface unit 36 (EMIF_2), and the direct memory access unit 38. $V_{storage}$ is a set of storage units, including the program counter 40, a register file 42, an L1 instruction cache 44, an L1 data cache 46, an L2 unified cache 48, local memory 50 and main memory 52. $E_{data\_transfer}$ is a set of data transfer edges, and $E_{pipeline}$ is a set of pipeline edges. An edge (pipeline or data-transfer) indicates connectivity between two components. A data-transfer edge transfers data between functional units and storage units. A pipeline edge transfers program operation from one functional unit to another functional unit.

The structure sets are described mathematically as follows:

$$V_S = V_{unit} \cup V_{storage}$$

$$E_S = E_{data\_transfer} \cup E_{pipeline}$$

$$E_{data\_transfer} \subseteq \{V_{unit}, V_{storage}\} \times \{V_{unit}, V_{storage}\}$$

$$E_{pipeline} \subseteq V_{unit} \times V_{unit}$$

In FIG. 1, the solid oval boxes denote functional units, the dotted oval boxes denote storage units, the solid arrows between functional units denote pipeline edges, and the dotted arrows between functional and storage units denote data-transfer edges. A path comprising units and pipeline edges from a root node, such as the instruction fetch unit 20, to a leaf node, such as the write back unit 30, is a pipeline path. An example of a pipeline path is the path Fetch->Decode->ALU->WriteBack. A path comprising units/storages and data-transfer edges from a functional unit to a storage unit is a data-transfer path. An example of a data-transfer path is the path MemCtrl->L1 Data->L2 Unified->MainMemory.

When the processor is in operation, the instruction fetch unit 20 fetches instructions from the memory sub-system 16, according to the value of the program counter 40. The instructions are fetched from the L1 instruction cache 44 or the L2 unified cache 48 if they have been previously cached therein, otherwise the instructions are fetched from main memory 52. The instruction decode unit 22 receives the fetched instructions from the instruction fetch unit 20 and decodes them for execution by the processor 12 or the co-processor, 14 as indicated by each instruction. The instruction decode unit 22 receives data from the register file 42, if appropriate. For example if the instruction is to perform an arithmetic operation on data in the register file 42, the data is fetched by the instruction decode unit 22. Similarly, if the instruction is to write data from the register file 42 to the main memory 52, the data is fetched from the register file 42. The instruction decode unit 22 then directs the decoded instructions to the ALU 24 if the instruction is an arithmetic instruction, to the address calculation unit 26 if the instruction is a memory access instruction, or to the first external memory interface 32 in the co-processor 14 if the instruction is a co-processor instruction.

For arithmetic instructions, the ALU 24 receives arithmetic instructions, performs the specified arithmetic operation on the specified data, updates the program counter 40 if necessary, and hands control off to the write back unit 30 to write the results of the ALU processing back to the register file 42.

For memory access instructions, the address calculation unit 26 calculates the memory address to be accessed by the instruction, and passes this address to the memory control unit 28. The memory control unit 28 uses the address to access the specified memory location, by accessing either the L1 data cache 46 or the L2 unified cache 48 if the specified memory location has been cached, or otherwise accessing the specified memory location in main memory 52. The memory control unit 28 also includes a feedback path to the ALU 24, should the ALU 24 need to receive a data value fetched from memory. If the instruction was a memory read instruction, the memory control unit 28 then passes control to the write back unit 30, where the read-in data value is written to the register file 42.

For co-processor instructions, the first external memory interface unit 32 receives co-processor instructions, for example multiplication instructions for a mathematic co-processor, or graphics processing instructions for a graphics co-processor. The first external memory interface unit 32 requests the data specified by the instruction from the direct memory access unit 38. The direct memory access unit 38 retrieves the requested data from the main memory 52 and populates the local memory 50 with the requested data. The co-processor 34 then accesses the requested data in the local memory 50 and performs the co-processing function (e.g. multiplication, interpolation, etc.) specified by the instruction on the requested data, and writes the modified data back to the local memory 50. The second external memory interface unit 36 then instructs the direct memory access unit 38 to write the modified data back from the local memory 50 to the main memory 52.

In addition to constructing a graph of the structure of the processor architecture, the behavior of the architecture is also captured in graph form. The behavior of a processor architecture is typically expressed by the instruction-set (ISA) description in the processor's user manual. This description includes a set of instructions that can be executed on the architecture, such as ADD, STORE, MOVE, etc. These instruction sets are well-known to those skilled in the art and will not be discussed in further detail herein. Each instruction includes a set of fields, such as an opcode field which specifies the instruction to be performed, and one or more argument fields which specify the input and output data locations for the data to be operated on and generated by the instruction. These fields specify, at an abstract level, the execution semantics of the instruction.

The behavior of the processor architecture is modeled as a graph $G_B=(V_B, E_B)$, where $V_B$ is a set of nodes and $E_B$ is a set of edges. The nodes represent the fields of each operation, while the edges represent orderings between the fields. The behavior graph $G_B$ is a set of disjointed sub-graphs, one for each instruction. Each sub-graph is called an instruction graph.

The behavior sets are described mathematically as follows:

$$V_B = V_{opcode} \cup V_{argument}$$

$$E_B = E_{operation} \cup E_{execution}$$

$$E_{operation} \subseteq V_{opcode} \times V_{argument} \cup V_{argument} \times V_{argument}$$

$$E_{execution} \subseteq V_{argument} \times V_{argument} \cup V_{argument} \times V_{opcode}$$

Nodes are of two types. $V_{opcode}$ is a set of opcode nodes that represent the opcode (i.e. the mnemonic for the instruction), and $V_{argument}$ is a set of argument nodes that represent argument fields (i.e. source and destination arguments). Edges are also of two types, $E_{operation}$ is a set of operation edges that link the fields of the instruction and also specify the syntactical ordering between them. $E_{execution}$ is a set of execution edges that specify the execution ordering between the fields.

An illustrative portion of the behavior graph 53 for the processor of FIG. 1 is shown in FIG. 2. The ADD node 54 and STORE node 62 are opcode nodes, while the SRC2 node 58, SRC1 node 56 and DEST node 60, as well as the other nodes linked to the STORE node 62, are argument nodes. The solid edges represent operation edges, while the dotted edges represent execution edges. For the ADD node 54, representing an ADD instruction, the operation edges specify that the syntactical ordering is the ADD opcode, followed by the DEST argument, SRC1 argument and SRC2 argument in that order. The execution edges specify that the SRC1 and SRC2 arguments are executed (i.e. read) before the ADD operation is performed. Finally, the DEST argument is written.

Once the structure and the behavior of the processor architecture have been captured as a graph, the instructions defined in the behavior are mapped to the components defined in the structure graph of the architecture. The architecture manual provides information regarding this mapping between the structure and the behavior, to indicate which components perform which instructions. A set of mapping functions are defined which map nodes in the structure, representing components, to nodes in the behavior, representing instructions, and vice-versa.

The unit-to-opcode (opcode-to-unit) mapping is a bi-directional function that maps unit nodes in the structure graph 10 to opcode nodes in the behavior graph 53. For example, the unit-to-opcode mappings for the architecture in FIG. 1 include mappings from the instruction fetch unit 20 to the ADD opcode 54, the STORE opcode 62, and all of the other opcodes for the instructions fetched by the instruction fetch unit 20. The mappings also include mappings from the ALU 24 to the ADD opcode 54 and the opcodes for the other instructions performed by the ALU 24. The mappings also include mappings from the address calculation unit 26 to the STORE opcode 62 and the opcodes for the other instructions performed by the address calculation unit 26. The other functional units of FIG. 1 are similarly mapped to their associated instruction opcodes.

The argument-to-storage (storage-to-argument) mapping is a bi-directional function that maps argument nodes in the behavior graph 53 to storage unit nodes in the structure graph 10. For example, the argument-storage mappings for the ADD operation are mappings from the DEST node 60, the SRC1 node 56 and the SRC2 node 58 to the register file 42. The other storage units of FIG. 1 are similarly mapped to their associated instruction arguments.

Once the architectural model has been designed, and the structure graph 10 and the behavior graph 53 have been constructed, a set of functional fault models is constructed, for the various functions of the pipelined processor of FIG. 1. A fault is a defect in the processor design, which causes the processor to fail to perform correctly. The various computations in the pipelined processor are categorized into four groups, "register read/write", "instruction execution", "execution path" and "pipeline execution". A fault model is constructed for each group, which models the conditions under which a particular activity in the processor incurs a fault.

For the register read/write function, to ensure fault-free operation all registers should be written and read correctly. That is, when a value is written to a register and then read back from the register, the value read should be the same as the value previously written. If there is a register read/write fault, then the value read will be different from the value previously written. This fault could be due to an error in reading from the register, or in decoding the register read/write instructions, or in writing to the register, or in the register storage itself. Mathematically, if the value $V_{Ri}$ is written into register $R_i$ and read back, the output should be the value $V_{Ri}$ in the fault-free case. In the presence of a fault, output$\neq V_{Ri}$.

For the instruction execution function, all instructions must execute correctly for there to be a fault-free state. In the presence of a fault, the output of the execution of an instruction is different from the expected output for that instruction. This fault could be due to an error in instruction decoding, in control generation, or in the computation of the output of the instruction. Erroneous operation decoding might return an incorrect opcode, thus causing the wrong instruction to be executed. This can happen if incorrect bits are decoded for the opcode. Selection of incorrect bits can also lead to erroneous decoding of the source and destination operands of the instruction, which would cause either incorrect input data to be provided, or the result to be written to an incorrect destination. Even if the decoding is correct, an incorrect computation unit can be enabled, due to an error in control generation. For example a faulty instruction decode unit 22 could incorrectly enable the address calculation unit 26 for an ADD instruction, instead of enabling the ALU 24. Finally, the functional unit which executes the instruction and performs the computation can be faulty. For example, the ALU 24 could perform incorrect addition or other mathematic functions. The outcome of an instruction execution fault is an unexpected result. Expressed mathematically, let $val_i = f_{opcode_i}(src_1, src_2, \ldots)$, denote the result of computing the instruction "$opcode_i$, dest, $src_1$, $src_2$, ..." In the fault-free case, the destination will contain the value $val_i$. Under a fault, the destination is not equal to $val_i$.

For the execution path, an execution path $ep_{opi}$ is faulty if it produces an incorrect result during execution of instruction $op_i$ in the pipeline. During execution of an instruction in the pipeline, one pipeline path and one or more data-transfer paths get activated. The combination of these activated paths is the execution path for that instruction. The fault could be due to an error in one of the paths (pipeline or data-transfer) in the execution path. A path is faulty if any one of its nodes or edges are faulty. A node is faulty if it accepts valid inputs and produces incorrect outputs. An edge is faulty if it does not transfer the data/instruction correctly to the next node.

Without loss of generality, assume that the processor has p pipeline paths ($PP = \cup_{i=1 \text{ to } p} pp_i$) and q data transfer paths ($DP = \cup_{j=1 \text{ to } q} dp_j$). Furthermore, each pipeline path $pp_i$ is connected to a set of data-transfer paths $DP_{grpi}$ ($DP_{grpi} \subseteq DP$). During execution of an instruction $op_i$ in the pipeline path $pp_i$, a set of data-transfer paths $DP_{opi}$ ($DP_{opi} \subseteq DP_{grpi}$) are used (activated). Therefore, the execution path $ep_{opi}$ for instruction $op_i$ is, $ep_{opi} = pp_i \cup DP_{opi}$. Assuming that operation $op_i$ has one opcode ($opcode_i$), m sources ($\cup_{j=1 \text{ to } m} src_j$) and n destinations ($\cup_{k=1 \text{ to } n} dest_k$). Each data-transfer path $dp_i$ ($dp_i \in DP_{opi}$) is activated to read one of the sources or write one of the destinations of $op_i$ in execution path $ep_{opi}$. Let $val_i$, where $val_i = f_{opcode_i}(\cup_{j=1 \text{ to } m} src_j)$, denote the result of computing the instruction $op_i$ in execution path $ep_i$. The $val_i$ has n components ($\cup_{k=1 \text{ to } n} val_j^k$). In the fault-free case, all the destinations will contain correct values, i.e., $\forall k \, dest_k = val_j^k$. Under a fault, at least one of the destinations will have incorrect value, i.e., $\exists k \, dest_k \neq val_i^k$.

For pipeline execution, an implementation of a pipeline is faulty if it produces incorrect results due to the execution of multiple instructions in the pipeline. Note that the previous fault models consider only one instruction at a time, whereas the pipeline execution fault model examines the execution of multiple instructions in the pipeline. The pipeline execution fault could be due to incorrect implementation of the pipeline controller. The faulty controller might have errors in the implementation of hazard detection, stalling, flushing, or exception handling schemes.

Let us define stall set for a unit u ($SS_u$) as all possible ways to stall that unit. Therefore, the stall set $StallSet = \cup_{\forall u} SS_u$. Let us also define an exception set for a unit u ($ES_u$) as all possible ways to create an exception in that unit. We define the set of all possible multiple exception scenarios as MESS. Hence, the exception set $ExceptionSet = \cup_{\forall u} ES_u \cup MESS$. We consider two types of pipeline interactions: stalls and exceptions. Therefore, all possible pipeline interactions (PIs) can be defined as: $PIs = StallSet \cup ExceptionSet$. Let us assume a sequence of operations $ops_{pi}$ causes a pipeline interaction pi (i.e., $pi \in PIs$), and updates n storage locations. Let $val_{pi}$ denote the result of computing the operation sequence $ops_{pi}$. The $val_{pi}$ has n components ($\cup_{k=1 \text{ to } n} val_{pi}^k$). $\forall k \, dest_k = val_i^k$. Under a fault, at least one of the destinations will have incorrect value, i.e., $\exists k \, dest_k \neq val_i^k$.

In an embodiment, functional coverage of a processor architecture model is based on the fault models described above. Consider the following cases for the fault coverage:

a fault in register read/write is covered if the register is written first and read later.

a fault in instruction execution is covered if the instruction is performed, and the result of the computation performed by the instruction is read.

a fault in an execution path is covered if the execution path is activated, and the result of a computation performed by the instruction that uses the execution path is read.

a fault in pipeline execution is covered if the fault is activated due to execution of multiple instructions in the pipeline, and the result of the computation performed by one or more of the instructions is read.

The faults discussed above are detected by executing a test program that is designed to cover a particular fault for a particular component of the architecture. For example, test programs are generated that cover the register read/write fault for each register present in the architecture (in the architecture of FIG. 1, this includes the program counter 40 and each of the registers in the register file 42). Similarly, test programs are generated to cover the other faults discussed above. The generation of these test programs is discussed in detail below. For a given set of test programs, the functional coverage of a pipelined processor is the ratio between the number of faults detected by the test programs and the total number of detectable faults in the fault model.

Once the graph model has been constructed and the fault models identified for the processor, test programs are generated to test each component of the processor to detect the faults identified by the fault models. For clarity, the following discussion refers to load and store instructions for making the register and memory contents observable at the data bus. Different architectures may use other specific instructions to access and observe the contents of registers and memories.

Each of the test generation procedures discussed below use the procedure createTestProgram shown in Table 1 to generate the actual test programs.

TABLE 1

Procedure 1: createTestProgram
Input: An instruction list instList.
Output: Modified instruction list with initializations.
begin
    resInstructions = { }
    for each instruction inst in instList
        assign values (opcode/operands) to unspecified fields in inst
        for each source src (register or memory type) of inst
            initInst: initialize src with appropriate value;
            resInstructions = resInstructions ∪ initInst;
        endfor
        resInstructions = resInstructions ∪ inst;
        readInst: create an instruction to read the destination of inst;
        resInstructions = resInstructions ∪ readInst;
    endfor
    return resInstructions.
end The procedure createTestProgram accepts a list of instructions as input, and returns a modified list of instructions, which is the test program. The instructions generated by the test generation procedures and received as input may be incompletely specified by the test generation procedures. For example, if a particular fault model does not require that a particular field of an instruction be assigned a value, then the test generation procedures discussed below do not assign a value to that field. However, when the test program is executed, all of the instructions must be fully specified, or else program execution will fail. Thus the procedure createTestProgram fills out these instructions with appropriate values for any unspecified locations, either opcodes or operands of the instructions. The procedure createTestProgram then creates initialization instructions for any uninitialized source operands, and then creates instructions to read the destination operands for each instruction in the instruction list. Finally, the procedure returns the modified list of instructions, which contains the initialization instructions, the modified input instructions, and the read instructions, in that order. This instruction list is in assembly format suitable for execution by a simulator or hardware implementation, to test the functioning of the microprocessor being designed.

The procedure of Table 2 below presents the procedure for generating test programs for detecting faults in the register read/write function.

TABLE 2

Procedure 2: Test Generation for Register ReadWrite
Input: Graph model of the architecture G.
Output: Test programs for detecting faults in register read/write.
begin
    TestProgramList = { }
    for each register reg in architecture G
        value$_{reg}$ = GenerateUniqueValue(reg);
        writeInst = an instruction that writes value$_{reg}$ in register reg.
        test prog$_{reg}$ = createTestProgram(writeInst)
        TestProgramList = TestProgramList ∪ test prog$_{reg}$;
    endfor
    return TestProgramList.
end The fault model for the register read/write function is discussed above. For each register in the architecture, the procedure generates an instruction sequence that includes a write of a pre-determined value to the register, followed by a read from the register. The function GenerateUniqueValue determines and returns a unique value for each register, based on the name of the register (e.g. "1" for register 1, "2" for register 2, etc.). For example, a test program for register $R_i$ will include two assembly instructions: "MOVI $R_i$, #val$_i$" and "STORE $R_i$, $R_j$, #0". The move-immediate (MOVI) instruction writes val$_i$ in register $R_1$. The STORE instruction reads the contents of $R_i$ and writes it in memory addressed by $R_j$ (offset 0).

The test sequence generated using the procedure of Table 2 is capable of detecting any detectable fault in the register read/write fault model. The test sequence generates one test program for each register in the architecture. A test program includes two instructions—a write followed by a read. Each register is written with a specific value, as provided in the procedure. If there is a fault in the register read/write function, the value read would be different from the value written.

The procedure of Table 3 presents the procedure for generating test programs for detecting faults in instruction execution.

TABLE 3

Procedure 3: Test Generation for Instruction Execution
Input: Graph model of the architecture G.
Output: Test programs for detecting faults in instruction execution.
begin
    TestProgramList = { }
    for each instruction inst in architecture G
        test prog$_{inst}$ = createTestProgram(inst);
        TestProgramList = TestProgramList ∪ test prog$_{inst}$;
    endfor
    return TestProgramList.
end The fault model for the instruction execution is discussed above. The procedure traverses the behavior graph of the architecture, and generates one test program for each instruction sub-graph in the behavior graph, using the createTestProgram discussed above. For example, a test program for the instruction sub-graph with the opcode ADD (ADD node 54 in FIG. 2) has three instructions: two initialization instructions ("MOV R3 #333", "MOV R5 #212") followed by the ADD instruction ("ADD R2 R3 R5"), followed by the reading of the result ("STORE R2, Rx, #0"). The procedure of Table 3 supplies the opcode for each instruction to the createTestProgram procedure. The createTestProgram procedure creates the initialization instructions and supplies the values for the ADD instruction, since those values were not specified by the procedure of Table 3 (because the specific values to be added together are not relevant to performing the test of the ADD instruction).

The test sequence generated using the procedure of Table 2 is capable of detecting any detectable fault in the instruction execution fault model. The procedure generates one test program for each instruction in the architecture, as those instructions are specified in the behavior graph. If there is a fault in instruction execution, the computed result of the instruction as executed would be different than the expected result of the instruction.

The procedure of Table 4 presents the procedure for generating test programs for detecting faults in the execution paths.

TABLE 4

Procedure 4: Test Generation for Execution Path
Input: Graph model of the architecture G.
Output: Test programs for detecting faults in execution path.
begin
    TestProgramList = { }
    for each pipeline path path in architecture G
        insgroup$_{path}$ = instructions supported in path.
        exec$_{path}$ = path and all data-transfer paths connected to it
        inst$_{path}$ = randomly select an instruction from insgroup$_{path}$
        if (inst$_{path}$ activates all edges in exec$_{path}$) ins$_{path}$ = inst$_{path}$
        else ins$_{path}$ = insgroup$_{path}$ endif
        for all instructions inst in ins$_{path}$
            for all source/destination operands opnd of inst
                for all possible register values val of opnd
                newInst = assign val to opnd of inst.
                testprog$_{inst}$ = createTestProgram(newInst).
                TestProgramList = TestProgramList ∪ testprog$_{inst}$;
                endfor
            endfor
    endfor
    return TestProgramList.
end The fault model for the execution paths is described above. The procedure traverses the structure graph of the processor architecture, such as the structure graph 10 of FIG. 1, and for each pipeline path it generates a group of instructions supported by that path. It randomly selects one instruction from each instruction group. If all of the edges in the execution path (containing the pipeline path) are activated by the selected instruction, the procedure generates all possible source/destination assignments for that instruction. However, if different instructions in the instruction group activate different sets of edges in the execution path, the procedure generates all possible source/destination assignments for each instruction in the instruction group. As an alternative to random selection, a heuristic algorithm or a priority scheme is used to identify instructions from the group which are more likely to activate all of the edges in the execution path containing the pipeline path.

The test sequence generated using the procedure of Table 4 is capable of detecting any detectable fault in the execution path fault model. The only way a detectable fault will be missed is if a pipeline or data-transfer edge is not activated (used) by the generated test programs. Assume that an edge $E_{pp}$ is not activated by any instructions. If the $E_{pp}$ is not part of (connected to) any pipeline path, the fault is not a detectable fault. If $E_{pp}$ is part of pipeline path pp, then if the pipeline path pp does not support any instructions, the fault is also not detectable. If the pipeline path pp does support at least one instruction, then the procedure of Table 4 will generate one or more instruction sequences that exercises the pipeline path and all of the data-transfer paths connected to it. Since the edge $E_{pp}$ is connected to the pipeline path pp, the edge is activated by the test program generated according to the procedure of Table 4.

The procedure of Table 5 presents a procedure for generating test programs for detecting faults in pipeline execution.

TABLE 5

Procedure 5: Test Generation for Pipeline Execution
Input: Graph model of the architecture G.
Output: Test programs for detecting faults in pipeline execution.
begin
    TestProgramList = { }
    L1: for each unit node unit in architecture G
        L2: for each exception exon possible in unit
            $template_{exon}$ = template for exception exon
            $testprog_{unit}$ = createTestProgram($template_{exon}$);
            TestProgramList = TestProgramList ∪ $testprog_{unit}$;
        endfor
        L3: for each hazard haz in {RAW, WAW, WAR, control}
            $template_{haz}$ = template for hazard haz
            if haz is possible in unit
                $testprog_{unit}$ = createTestProgram($template_{haz}$);
                TestProgramList = TestProgramList ∪
                $testprog_{unit}$;
            endif
        endfor
        L4: for each parent unit parent of unit
            $inst_{parent}$ = an instruction supported by parent
            resultIns = createTestProgram($inst_{parent}$);
            $testprog_{unit}$ = a test program to stall unit (if exists)
            $testprog_{parent}$ = resultIns ∪ $testprog_{unit}$
            TestProgramList = TestProgramList ∪ $testprog_{parent}$;
        endfor
    endfor
    L5: for each ordered n-tuple ($unit_1$, $unit_2$, . . . , $unit_n$) in graph G
        $prog_1$ = a test program for creating exception in $unit_1$
        . . .
        $prog_n$ = a test program for creating exception in $unit_n$
        $testprog_{tuple}$ = composeTestProgram($prog_1$ ∪ . . . ∪ $prog_n$);
        TestProgramList = TestProgramList ∪ $testprog_{tuple}$;
    endfor
    return TestProgramList.
end The fault model for pipeline execution is described above. The procedure of Table 5 contains five loops, each of which is discussed below. The first loop (L1) traverses the structure graph of the architecture in a bottom-up manner, starting at the leaf nodes, and iteratively calls each of the loops L2, L3 and L4 for each node of the structure graph. The second loop (L2) computes test programs for generating all possible exceptions in each unit node in the architecture, based on a program template for each possible exception. The program template includes the instructions required to cause the exception. This template is passed to the procedure createTestProgram where it is filled out as discussed above to create a complete test program, and joined with the rest of the test programs for execution.

The third loop (L3) computes test programs for generating all possible stall conditions due to data and control hazards in each unit node in the architecture, based on a program template for each possible stall condition. The program template includes the instructions required to cause the stall condition. Each unit node is checked to see if it is a node that can generate a stall condition, and if it can, the template is passed to the procedure createTestProgram where it is filled out as discussed above to create a complete test program, and joined with the rest of the test programs for execution.

The fourth loop (L4) computes test programs for generating all possible stall conditions due to structural hazards in each unit node in the architecture, based on a program template for each possible stall condition. The program template includes the instructions required to cause the stall condition. A test program is created for each parent node for the node being tested, and this test program is joined with a template-based test program that stalls the node being tested, if such a stall program exists. If it does, the template is passed to the procedure createTestProgram where it is filled out as discussed above to create a complete test program, and joined with the test program for the parent and the rest of the test programs for execution.

Finally, the last loop (L5) computes test sequences for multiple exceptions involving more than one unit. The loop L5 investigates every ordered n-tuple of units in the structure graph, and generates a test program to cause an exception in each node of the n-tuple being investigated (or retrieves the test program if it has already been generated). The test programs are then combined into a composite test program using the composeTestProgram function, which combines test programs in an ordered union of programs, adding the test program for the unit closer to completion first. The composeTestProgram function also removes dependencies across test programs, to ensure the generation of multiple exceptions during the execution of the combined test program.

The test sequence generated using the procedure of Table 5 is capable of detecting any detectable fault in the pipeline execution fault model. The procedure generates test programs for all possible interactions during pipeline execution. The first loop (L1) generates all possible hazard and exception conditions for each functional unit in the pipeline. The test programs for creating all possible exceptions in each node are generated by the second loop (L2). The third loop (L3) generates test programs for creating all possible data and control hazards in each node. Similarly, the fourth loop (L4) generates test programs for creating all possible structural hazards in a node. Finally, the last loop (L5) generates test programs for creating all possible multiple exception scenarios in the pipeline.

An example of the application of the graph model of the architecture, the fault models and the test program generation procedures to two pipelined architectures will now be discussed. The two architectures discussed in this example are a Very Long Instruction Word (VLIW) implementation of the DLX architecture, presented in J. Hennessy and D. Patterson, Computer Architecture: A Quantitative Approach, Morgan Kaufmann Publishers, Inc. San Mateo, Calif., 1990, and a Reduced Instruction Set Computing (RISC) implementation of the SPARC V8 architecture, presented in The SPARC Architecture Manual, Version 8, available from Sparc International of Campbell, Calif.

The test generation and coverage analysis framework of this example were developed using Specman Elite, available from Cadence Design Systems of San Jose, Calif. The architecture specifications were captured in executable form using Cadence's "e" language. These specifications include description of 91 instructions for the DLX, and 106 instructions for the SPARC v8 architectures.

This example also implements a VLIW version of the DLX architecture using Cadence's "e" language. FIG. 3 shows a simplified version of the VLIW DLX architecture, in graph form. The DLX architecture graph includes five pipeline stages, fetch, decode, execute, memory and writeback. The fetch stage includes an instruction fetch unit 70. The decode stage includes an instruction decode unit 72. The execute stage includes four parallel execution paths, an ALU 74, a four-stage floating-point adder 78, a seven stage multiplier 76, and a multi-cycle divider 80. The memory stage includes a memory access unit 82. The writeback stage includes a writeback unit 84. The functional units and storage units are connected as shown in FIG. 3, in a manner similar to that discussed with reference to the example processor architecture of FIG. 1. The SPARC V8 architecture is different in some respects than the DLX architecture, but for purposes of clarity and brevity of discussion, the SPARC V8 architecture will not be shown. The differences between these two architectures do not affect the underlying operation of the systems and methods disclosed herein. The processor used as an example of the SPARC V8 architecture is the LEON2 processor, available from Gaisler Research of Goteborg, Sweden. The VLIW DLX and LEON2 SPARC V8 processor models implemented will be referred to herein as implementations, to distinguish them from the specifications of the processor models, discussed above.

The framework of this example generates test programs in three different ways: random, constrained-random, and the functional coverage approach discussed herein. Specman Elite was used to generate the random and constrained-random test programs from the specification. For the constrained-random approach, several constraints are applied. For example, to generate test programs for the register read/write fault model, the Specman Elite software was instructed to use the highest possibility for choosing register-type operations in DLX. Since register-type instructions have three register operands, the chances of reading/writing registers are higher than immediate type (two register operands) or branch type (one register operand) instructions. The test programs generated by the function coverage approach uses the procedures discussed in Tables 1-5 above.

To ensure that the generated test programs are executed correctly, the framework applies the test programs both on the implementations as well as the specifications, and compares the contents of the program counter, registers and memory locations after execution of each test program, as shown in the method of FIG. 4.

At step 110 of FIG. 4, the test program is generated according to the procedures of Tables 1-5 above. At step 115, the test program is executed using the specification of the processor model. At step 120, the test program is executed using the implementation of the processor model. At step 125, the contents of the program counter, the registers and the memory of the specification model and the implementation model are compared, to ensure that the test programs were executed correctly on the implementation model. If the contents match, then at step 130, the implementation is reported as having successfully executed the test program. Otherwise at step 135, the implementation is reported as having failed to successfully execute the test program, and thus is reported as an incorrect implementation of the specification for that processor.

The Specman Elite framework allows definition of various coverage measures, which are used to compute the functional coverage discussed above. Each entry in the instruction definition (e.g. opcode, destination and sources) is defined in the framework as a coverage item. The coverage for the destination operand gives the measure of which registers are written. Similarly, the coverage of the source operands gives the measure of which registers are read. A different variable is used corresponding to each register, to identify a read after a write. Computation of coverage for instruction execution is done by observing the coverage of the opcode field. That is, the coverage for instruction execution is the ratio of opcodes generated by the test programs to all defined opcodes in the architecture. The computation of coverage for the execution paths is performed by observing if all the registers are used for computation of all or selected opcodes. This is performed by using cross coverage of instruction fields in Specman Elite that computes every combination of values of the fields. Finally, the coverage for pipeline execution is computed by maintaining variables for all stalls and exceptions in each functional unit. The coverage for multiple exceptions is obtained by performing cross coverage of the exception variables (events) that occur simultaneously.

Table 6 shows a comparison of the results generated by the functional coverage approach discussed above against the random and constrained-random test programs generated by Specman Elite.

TABLE 6

| | Test Generation Techniques | | |
|---|---|---|---|
| Fault Models | Random | Constrained | Functional Approach |
| Register Read/Write | 3900 (100%) | 750 (100%) | 130 (100%) |
| Operation Execution | 437 (100%) | 443 (100%) | 182 (100%) |
| Execution Path | 12627 (100%) | 1126 (100%) | 320 (100%) |
| Pipeline Execution | 30000 (25%) | 30000 (30%) | 626 (100%) |

The rows indicate the fault models, and the columns indicate the test generation techniques. Each entry in Table 6 has two, numbers. The first number represents the minimum number of test programs generated by that test generation technique for that fault model. The second number (in parentheses) represents the functional coverage obtained by the generated test programs for that fault model, expressed as a percentage. A 100% coverage means that the generated test programs covered all the detectable faults in that fault model. For example, the Random technique covered all the faults in "Register Read/Write" function, using 3,900 test programs. The number of test programs used for operation execution are similar for both random and constrained-random approaches. This is because the constraint used in this case (same probability for generation of all opcodes) appears to be the default option used in the random test generation approach.

The functional coverage approach was also compared to the conventional code coverage measure for determining the coverage of a set of test programs. Table 7 compares the functional coverage against conventional HDL code coverage. The first column indicates the functional fault models. The second column presents the minimum number of test programs necessary to cover all the functional faults in the corresponding fault model. The last column presents the code coverage obtained for the DLX implementation using the test programs mentioned in the second column. The test programs generated by the functional approach discussed above resulted in a small number of test programs which generate a high coverage ratio as measured by the code coverage metric.

TABLE 7

| Fault Models | Test Programs | HDL Code Coverage |
| --- | --- | --- |
| Register Read/Write | 130 | 85% |
| Operation Execution | 182 | 91% |
| Execution Path | 320 | 86% |
| Pipeline Execution | 626 | 100% |

Table 8 shows the comparative results for the different test generation approaches as applied to the LEON2 processor. The trend is similar to the results of Table 6, in terms of number of operations and fault coverage for both the DLX and the LEON2 architectures. The random and constrained-random approaches obtained 100% functional coverage for the first three fault models using an order of magnitude more test programs than the functional approach discussed above.

TABLE 8

| | Test Generation Techniques | | |
| --- | --- | --- | --- |
| Fault Models | Random | Constrained | Functional Approach |
| Register Read/Write | 1746 (100%) | 654 (100%) | 130 (100%) |
| Operation Execution | 416 (100%) | 467 (100%) | 212 (100%) |
| Execution Path | 1500 (100%) | 475 (100%) | 192 (100%) |
| Pipeline Execution | 30000 (40%) | 30000 (50%) | 248 (100%) |

The random and constrained-random approaches both generated a low fault coverage for the Pipeline Execution fault model, for both processors. This occurred because these two approaches were unable to activate any of the multiple exception scenarios, and were also unable to activate some of the single exception faults. The DLX architecture has a lower coverage percentage than the LEON2 architecture because DLX has a larger set of pipeline interactions. This functional coverage problem experienced by the conventional techniques will be even greater as processors are implemented with ever larger pipelines.

Generation of test programs according to the functional approach discussed above is further automated with improved test generation time using model checking according to the following discussion. Turning to FIG. 5, a graph-based functional test program generation method is shown. The method begins at step 200 with an architecture specification in written form, such as a description found in a processor architecture manual or a user's manual for a processor. At step 205, the processor designer specifies the processor architecture in an Architecture Description Language (ADL). One possible ADL that can be used is the EXPRESSION ADL, discussed in A. Halambi et al, EXPRESSION: A Language for Architecture Exploration through Compiler/Simulator Retargetability. DATE, 1999. The method of FIG. 5 is independent of the particular ADL chosen, as long as the ADL is capable of capturing both the structure and the behavior of the processor being modeled. At step 207, a set of generic templates are provided, which model the various components of a processor design. At step 210, the ADL specification and the generic templates written using SMV language are automatically combined, to create the graph model of the processor design. At step 212, a set of properties is generated for each functional unit in the graph model, using the graph coverage metric discussed below. At step 215, a functional unit within the processor design is selected for analysis. At step 217, a property for the selected functional unit is identified and at step 220 the property is applied to the functional unit using the SMV model checker. This property can be a property that the designer wishes to verify, such as assigning a value to a register (i.e. R7=5). Alternatively, this property can be the negation of a property that the designer wishes to verify, such as assigning any value other than the desired value to a register (i.e. R7!=5). Expressing the property in negation form is useful to enable test generation using model checkers such as SMV. At step 225, the SMV model checker generates one or more counterexamples, which specify the input requirements for the selected functional unit that are used to put the node in a state corresponding to the negation of the property. Since the property was expressed in negation form, the counterexample negates the negation, which results in the node being placed in the state corresponding to the test case that the designer wishes to model. At step 230, each counterexample is analyzed to determine the input requirements for the node being analyzed. If at step 232, the inputs are not primary inputs for the processor (i.e., the inputs depend on data provided from another parent node in the graph model), then at step 233, the parent node's output requirements are determined. The parent node is retrieved at step 235. The property is modified based on the output requirements of the parent at step 217, and then applied to the parent node at steps 220-232. This iteration continues until primary input assignments are obtained. These primary input assignments are converted into test programs (instruction sequences) by putting random values in the un-assigned inputs, and putting the values generated by the iterative method of FIG. 5 into the assigned inputs. The test programs are then provided to the simulator at step 240, which executes the test programs to generate the coverage report and the test cases, including the expected outputs for the processor.

The operation of the method of FIG. 5 is shown in procedural form in Table 9 below.

TABLE 9

Procedure 6: Automatic Test Program Generation
Inputs: ADL specification of the pipelined processor
Outputs: Test programs to verify the pipeline behavior.
Begin
    Generate graph model of the architecture.
    Generate properties based on the graph coverage
    for each property prop for graph node n
        inputs = φ
        while (inputs != primary inputs)
            Apply prop on node n using SMV model checker
            inputs = Find input requirements for n from
            counterexample
            if inputs are not primary inputs
                Extract output requirements for parent of
                node n
                prop = modify prop with new output
                requirements
                n = parent of node n
            endif
        endwhile
    Convert primary input assignments to a test program
    Generate the expected output using a simulator.
    endfor
    return the test programs
End The ADL contains information regarding the structure, behavior and mapping (between structure and behavior) of the processor. As discussed above with reference to FIG. 1, the structure contains the description of each component of the processor, and the connectivity between the components. In addition to the units and storages discussed above, the components of the processor may also include ports and connections (i.e. busses). Each component has a list of attributes. For example, a functional unit will have information regarding its ports, connections, supported opcodes, execution timing and capacity. The connectivity is established using pipeline and data-transfer paths, as discussed above. The behavior of the processor contains the description of each instruction in terms of its opcode, operands, behavior and instruction format. Finally, the mapping functions define how the instructions in the behavior graph are mapped into the structures of the structure graph, as discussed above. For example, an instruction ADD is mapped to the ALU of FIG. 1

In creating the graph model of the architecture from the ADL description, the structure of each functional unit is captured using parameterized functions. For example, an instruction fetch unit such as the instruction fetch unit 20 of FIG. 1 or instruction fetch unit 70 of FIG. 3 contains several parameters, such as the number of operations read per clock cycle, the reservation station size, the branch prediction scheme, etc. Table 10 shows a specific example of an instruction fetch unit described using sub-functions to implement the functionality of the unit.

TABLE 10

```
FetchUnit ( # of read/cycle, res-station size, . . .)
{
        address = ReadPC( );
        instructions = ReadInstMemory(address, n);
        WriteToReservationStation(instructions, n);
        outInst = ReadFromReservationStation(m);
        WriteLatch(decode_latch, outInst);
        pred = QueryPredictor(address);
        if pred {
                nextPC = QueryBTB(address);
                SetPC(nextPC);
        } else
        IncrementPC(x);
}
```

Each sub-function is defined using appropriate parameters. For example, ReadInstMemory reads n instructions from the instruction cache using the current PC address (returned by ReadPC) and writes them to the reservation station. Using generic sub-functions in the manner shown in Table 10 allows the system to be specified in finer detail, and also allows for the re-use of the sub-functions in other units, without incurring the extra overhead of regenerating the functionality expressed in the sub-functions.

The behavior of the processor being modeled is captured through the definition of opcodes, as discussed with reference to FIG. 2 above. Each opcode is defined as a function with a generic set of parameters, which performs the intended functionality. Similarly, generic functions and sub-functions are defined for other components, such as memory modules, controllers, interrupts, exception handlers, DMA modules and co-processors.

The graph model is organized as discussed above with reference to FIGS. 1 and 3. Each node of the graph contains information regarding input/output edges, a list of supported instructions and their timing, and the SMV description of the node's behavior. The SMV description of each node is generated by composing functional abstraction primitives. For example, a simplified version of the SMV description of the instruction fetch unit (Fetch) is shown in Table 11.

TABLE 11

```
module Fetch (PC, InstMemory, operation)
{
        input PC : integer;
        input InstMemory : memory;
        output operation : opType;
        init(operation.opcode) := NOP;
        next(operation) := InstMemory[PC];
}
```

The Fetch module has two inputs, PC and InstMemory (instruction memory), and one output, operation, which outputs the operation type to the next node in the graph. The fetch module has two instructions that it supports, the initialization instruction and the next instruction.

The functional coverage metric used in the functional approach is a coverage metric based on functional coverage of the processor pipeline, which covers all possible interactions between opcodes (instructions) and pipeline stages (paths) in the processor model, as represented by the structure graph of the processor. When the structure graph is completely covered, then the processor model is considered covered by the functional coverage metric. The structure graph is considered covered if all of the graph nodes are covered and all of the graph edges are covered. A node in the graph is covered if it has been in all of the four possible states for a processor node: active, stalled, exception and flushed. A node is active when it is executing an instruction. A node can be stalled due to structural, control or data hazards. A node can be in an exception state if it generates an exception while executing an instruction. It is possible to have multiple exception scenarios and stall conditions for a node. However, a node may be considered covered as long as it enters at least one exception scenario and one stall condition. A node is in the flushed state if an instruction in the node is flushed due to the occurrence of an exception in any of its children nodes.

Similarly, an edge in the graph is considered covered if it has been in all of the three states possible for an edge in the processor model: active, stalled, and flushed. An edge is active when it is used to transfer an instruction in a clock cycle. An edge is stalled if it does not transfer an instruction in a clock cycle from a parent node to a child node. An edge is flushed if the parent node is flushed due to an exception in the child node. The edge coverage conditions are redundant if a node has only one child, because the node coverage conditions will necessarily also cover the edges. However, if a node has multiple children (or parents), edge coverage conditions are necessary.

The test generation method discussed with reference to FIG. 5 above traverses the pipeline graph and generates properties based on the graph coverage described above. For example, consider the test generation for a feedback path (edge) from MUL7 to IALU in FIG. 3. To generate a test for making the feedback path active, two properties are generated, which define the conditions necessary for activating the feedback path. The first property is: make the node MUL7 active in clock cycle t. The second property is: make the node IALU active in clock cycle (t+1). These properties cause a test program to be created, according to the method of FIG. 5, that has a multiply instruction, followed by six NOP (no operation) instructions, and finally an ADD instruction. The multiply instruction enters the pipeline first, and is directed to the 7-cycle multiplier. The six NOP instructions enter the pipeline next, and push the multiply instruction down to the MUL7 node, activating it. The ADD operation enters the pipeline next, which activates the IALU node in the next clock cycle, thus causing the feedback edge to be activated.

An example of the results of an implementation of the method of FIG. 5 will now be discussed, using the DLX processor discussed with reference to FIG. 3 above. This discussion presents the number of test cases which were generated for the DLX processor using the functional coverage described above. The DLX processor shown in FIG. 3 has 20 nodes and 24 edges (not counting feedback paths). The DLX processor has 91 instructions described for it.

Table 12 shows the number of test programs generated for node and edge coverage of the DLX processor, according to the method discussed above.

TABLE 12

| Node Coverage | | | | Edge Coverage | | |
|---|---|---|---|---|---|---|
| Active | Stalled | Flushed | Exception | Active | Stalled | Flushed |
| 91 | 20 | 20 | 20 | 24 | 24 | 24 |

Although 20 test cases would suffice for the active node coverage, this example covers all 91 instructions. Also, there are many ways of making a node stalled, flushed or in an exception condition. This example chose one such condition for each node. If all possible scenarios were considered, the number of test programs would increase. In this example, the method discussed above generated 223 test programs in 91 seconds on a 333 Mhz Sun UltraSPARC-II with 128M RAM.

As mentioned above, some of the test programs are redundant. For example, since the processor model of FIG. 3 has four pipeline paths, it is possible to use only four test programs, which each exercise one of the four paths. These four test programs will make all the nodes active. Similarly, for the processor model of FIG. 3, the decode will be stalled if any one of its four children are stalled. Furthermore, if the MEM node is stalled, all of its four parents will also be stalled. Thus only 14 test cases are necessary to cover the node stalling case. Likewise, if the MEM node is in exception, the instructions in all of the previous nodes will be flushed. Hence only 2 test cases (MEM exception and WriteBack exception) are necessary to cover the node flushing case. Finally, some of the node coverage test cases also satisfy the edge coverage. For the processor model of FIG. 3, the edges are all covered by the node coverage test cases, except for three of the stalled edge scenarios, which require three additional test cases. Thus the reduced set of 43 test cases shown in Table 13 is all that are needed for the processor model of FIG. 3.

TABLE 13

| Node Coverage | | | | Edge Coverage | | |
|---|---|---|---|---|---|---|
| Active | Stalled | Flushed | Exception | Active | Stalled | Flushed |
| 4 | 14 | 2 | 20 | 4 | 14 + 3 | 2 |

Figure 6:
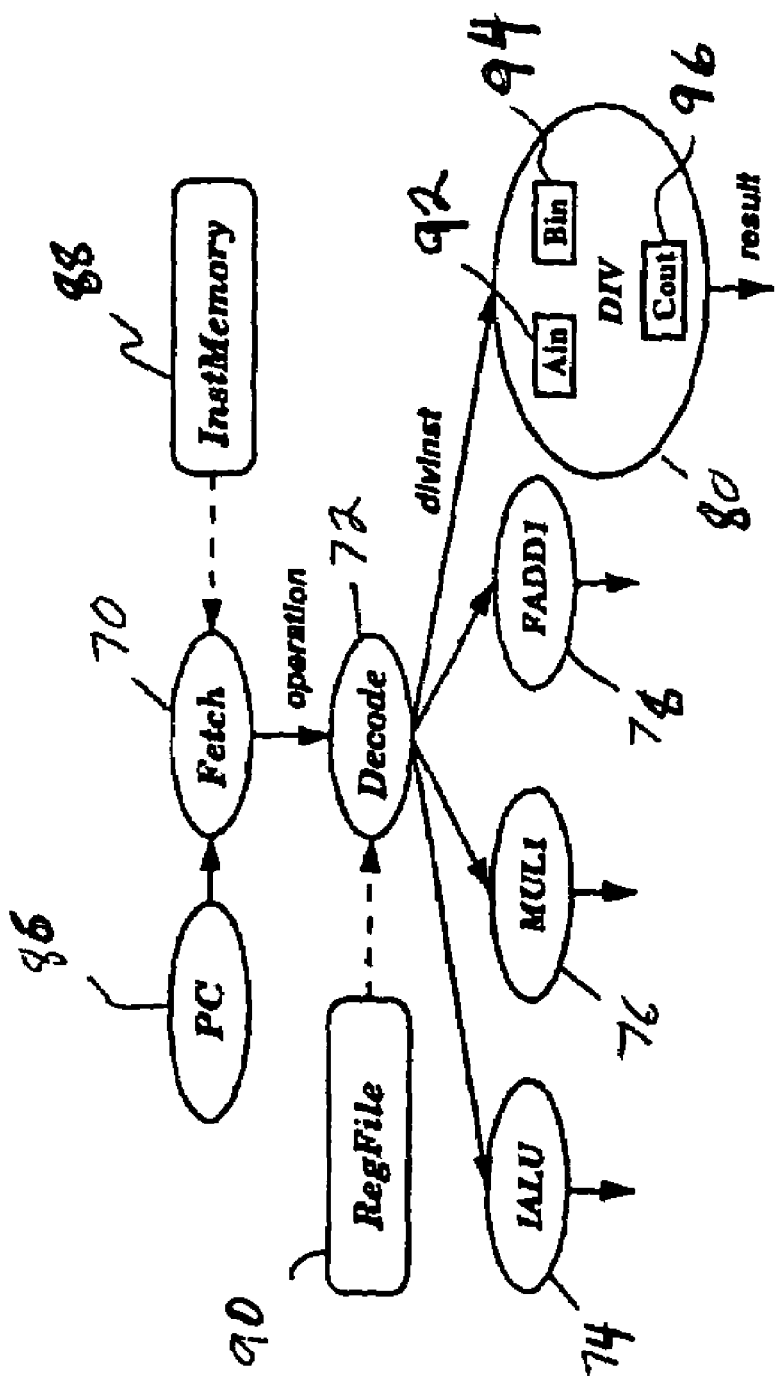
FIG. 6 depicts a portion of the structure graph of FIG. 3, with the DIV node expanded.

A specific example of creating a test program according to the method of FIG. 5 will now be discussed. Considering the fragment of the DLX processor model of FIG. 3, as shown in FIG. 6, the goal of this example is to create a test program that initializes two register $A_{in}$ and $B_{in}$ with values 2 and 3 respectively at clock cycle 9. The fragment shown in FIG. 6 includes the instruction fetch unit 70, the instruction decode unit 72, the IALU 74, the 7-cycle multiplier 76, the four-cycle adder 78, the multi-cycle division unit 80, the program counter 86, the memory 88 and the register file 90, all as discussed with reference to FIG. 3 above. The multi-cycle division unit 80 is expanded to show two internal input registers 92 and 94, and an internal output register 96. The input instruction to the division unit 80 is divInst, and the output is result. In this example, $A_{in}$ and $B_{in}$ receive data from the first and second source operands of the input instruction (divInst). Thus, $A_{in}$=divInst.src1 and $B_{in}$=divInst.src2. $C_{out}$ returns the result of the division. Thus $C_{out}=A_{in}/B_{in}$. Finally, the output is fed from $C_{out}$; thus result=$C_{out}$.

Using the language of the SMV verifier, a property is created which is used to generate the instruction sequence to initialize $A_{in}$ and $B_{in}$ with values 2 and 3 respectively at clock cycle 9. This property reads as follows:

assert G((cycle=8)->X((DIV.Ain~=2)|(DIV.Bin~=3)));

The property implies that if the current clock cycle is 8, in the next cycle DIV.Ain should not be 2 or DIV.Bin should not be 3. Recall that the property are expressed in negation form when using the SMV language. This property is then slightly modified to make it applicable at the module level, by removing the "DIV." header from the input names.

assert G((cycle=8)->X((Ain~=2)|(Bin~=3)));

The modified property is then applied to the division unit 80 using the SMV description of the division unit 80 (step 220 of FIG. 5). Next, the counterexample produced by the SMV verifier (step 225 of FIG. 5) is analyzed to extract the input requirements for the division unit 80. For this example, the input requirements are simply divInst.src1=2 and divInst.src2=3 (step 230 of FIG. 5). Since the inputs are not primary inputs (step 232 of FIG. 5), these input requirements are used to generate the expected output assignments for the decode unit 72, which is the parent node of the division unit 80 (step 233 of FIG. 5). Also, the cycle count requirement is modified (step 217 of FIG. 5) to reflect the proper clock cycle for the decode unit 72, such that the instruction arrives at the division unit 80 on cycle 9 as required by the conditions of this example. This modified property, shown below, is then applied to the decode unit 72 (step 220 of FIG. 5).

assert G((cycle=7)->X((divInst.src1 ~=2)|(divInst.src2~=3)));

The counterexample generated by this property (step 225 of FIG. 5) is then analyzed to extract the input requirements for the decode unit 72 (step 230 of FIG. 5). The decode unit 72 has two inputs: operation and regFile. In this example, the input requirements are: operation.opcode=DIV, operation.src1=1, operation.src2=2, RegFile[1]=2 and RegFile[2]=3. This indicates that the operation should be a division operation, with src1 as R1 and src2 as R2. It also implies that the register file should have the values 2 and 3 at locations 1 and 2 respectively. Thus there are two tasks to be performed here. First, initialize a register file location with a specific value at a given clock cycle t. This is done using a move-immediate instruction fetched at (t−5). In this case, the move-immediate instructions should be performed at clock cycles 2 and 3 to make the data available at clock cycle 8, which is the clock cycle specified in the original property defined for this example. The second task is to convert the remaining input requirements as the expected outputs for the fetch unit 70, which is the parent of the decode unit 72 (step 233 of FIG. 5).

assert G((cycle=6)->X((operation.opcode~=DIV)|
(operation.src1~=1)|(operation.src2~=2)));

This modified property is applied to the fetch unit 70 (step 220 of FIG. 5). The counterexample generated by this property (step 225 of FIG. 5) is then analyzed to extract the input requirements for the fetch unit 70. The fetch unit 70 has two inputs: PC and instruction memory. The expected value for PC is 5, and InstMemory[5] has the instruction: DIV $R_x$ $R_1$ $R_2$. These are primary inputs for the processor. The final test program, shown below, is constructed by putting random values in the unspecified fields (such as the destination field for the DIV instruction).

| Fetch Cycle | Opcode | Dest | Src1 | Src2 | Comments |
|---|---|---|---|---|---|
| 1 | NOP | | | | R0 is always 0 |
| 2 | ADDI | R1, | R0, | #2 | R1 = 2 |
| 3 | ADDI | R2, | R0, | #3 | R2 = 3 |
| 4 | NOP | | | | |
| 5 | NOP | | | | |
| 6 | NOP | | | | |
| 7 | DIV | R3, | R1, | R2 | |

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense, and the invention is not to be restricted or limited except in accordance with the following claims and their legal equivalents.

We claim:

1. A method of validating a pipelined processor, comprising:
   receiving a functional description of a processor architecture;
   creating a graph-theoretic model of the processor architecture using the functional description, wherein the graph-theoretic model comprises a structure graph and a behavior graph;
   constructing a set of functional fault models for the processor architecture, which model a set of functional faults; and
   constructing a plurality of test programs, wherein each test program covers a functional fault for the processor architecture.

2. The method of claim 1, wherein the structure graph comprises a set of nodes representing processor components and a set of edges representing connections between the nodes.

3. The method of claim 1, wherein the behavior graph comprises a plurality of instruction sub-graphs.

4. The method of claim 1, wherein creating a graph-theoretic model of the processor architecture further comprises mapping the behavior graph to the structure graph.

5. The method of claim 1, wherein the set of functional fault models provides a functional coverage of substantially all detectable faults in the processor architecture.

6. The method of claim 1 further comprising:
   executing the plurality of test programs on the pipelined processor.

7. The method of claim 6, wherein executing the plurality of test programs on the pipelined processor comprises executing the plurality of test programs on a specification of the pipelined processor and an implementation of the pipelined processor.

8. The method of claim 7, further comprising comparing an expected value generated by the test program when executed on the specification of the pipelined processor against an actual value generated by the test program when executed on the implementation of the pipelined processor.

9. A method of validating a pipelined processor, comprising:
   receiving a functional description of a processor architecture;
   creating a graph-theoretic model of the processor architecture using the functional description;
   constructing a set of functional fault models for the processor architecture, which model a set of functional faults, wherein the set of functional fault models comprises a register read/write fault, an instruction execution fault, an execution path fault and a pipeline execution fault; and
   constructing a plurality of test programs, wherein each test program covers a functional fault for the processor architecture.

10. A method of validating a pipelined processor, comprising:
    receiving a functional description of a processor architecture;
    creating a graph-theoretic model of the processor architecture using the functional description;
    constructing a set of functional fault models for the processor architecture, which model a set of functional faults, wherein the set of functional fault models comprises a pipeline execution fault, and wherein the pipeline execution fault is selected from the group consisting of: a hazard detection fault, a stalling fault, a flushing fault, and an exception handling fault; and
    constructing a plurality of test programs, wherein each test program covers a functional fault for the processor architecture.

11. A method of generating a test program for validating a pipelined processor comprising:
    receiving an architecture specification of the pipelined processor;
    receiving a set of generic templates which model a set of components of the pipelined processor;
    automatically combining the architecture specification and the set of templates to generate a graph-theoretic model of the pipelined processor;
    selecting a component to analyze;
    receiving a property of the selected component;
    generating a counterexample for the property; and
    creating a test program based on the counterexample.

12. The method of claim 11, wherein the architecture specification is specified in an architecture description language.

13. The method of claim 11, further comprising:
    determining an input requirement of the component.

14. The method of claim 11, further comprising:
    determining an output requirement of a parent component of the component;
    modifying the property based on the output requirement.

15. The method of claim 11, further comprising executing the test program on a simulator to generate an expected value for the test program.

* * * * *